United States Patent
Cho et al.

(10) Patent No.: US 6,579,808 B2
(45) Date of Patent: Jun. 17, 2003

(54) METHOD OF FABRICATING A SEMICONDUCTOR DEVICE

(75) Inventors: Sung Yoon Cho, Seoul (KR); Jae Heon Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/067,955

(22) Filed: Feb. 5, 2002

(65) Prior Publication Data

US 2003/0096503 A1 May 22, 2003

(30) Foreign Application Priority Data

Oct. 15, 2001 (KR) .................................... 2001-0063309

(51) Int. Cl.⁷ ............................................ H01L 21/461
(52) U.S. Cl. ...................... 438/725; 438/689; 438/694; 438/695; 438/696; 438/700; 438/706; 438/710; 438/711; 438/719; 438/789; 438/790
(58) Field of Search ................................ 438/689, 694, 438/695, 696, 700, 706, 710, 711, 719, 725, 789, 790

(56) References Cited

U.S. PATENT DOCUMENTS

| | | | |
|---|---|---|---|
| 5,763,327 A | 6/1998 | Blasingame et al. | |
| 5,885,902 A | 3/1999 | Blasingame et al. | |
| 5,910,453 A | 6/1999 | Gupta et al. | |
| 5,935,762 A | 8/1999 | Dai et al. | |
| 6,080,678 A | 6/2000 | Yim | |
| 6,103,632 A | 8/2000 | Kumar et al. | |
| 6,110,826 A | 8/2000 | Lou et al. | |
| 6,136,679 A | 10/2000 | Yu et al. | |
| 6,153,541 A | 11/2000 | Yao et al. | |
| 6,174,818 B1 | 1/2001 | Tao et al. | |
| 6,177,355 B1 | 1/2001 | Shields et al. | |
| 6,242,165 B1 | 6/2001 | Vaartstra | |
| 6,245,669 B1 | 6/2001 | Fu et al. | |
| 6,415,198 B1 * | 7/2002 | Nallan et al. ................ | 438/710 |

FOREIGN PATENT DOCUMENTS

| | | |
|---|---|---|
| JP | 3229886 | 10/1991 |
| JP | 5275190 | 10/1993 |
| JP | 7233490 | 9/1995 |
| JP | 114108 | 4/2000 |
| JP | 114109 | 4/2000 |

* cited by examiner

*Primary Examiner*—Kamand Cuneo
*Assistant Examiner*—Lisa Kilday
(74) *Attorney, Agent, or Firm*—Ladas & Parry

(57) ABSTRACT

A method for fabricating a semiconductor device capable of maintaining contact hole of fine size when the contact hole for bit line formation is defined. The method comprises the steps of: sequentially forming an insulating layer and an Anti-Reflective Coating layer on a substrate, the substrate including conductive regions; forming a photoresist pattern opening in the Anti-Reflective Coating layer over the conductive regions; removing the Anti-Reflective Coating layer in accordance with a first dry etch process using a mixed gas of $SO_2$ and He and employing the photoresist pattern as an etch mask and at the same time, attaching polymers resulting from the dry etch process to the side of remaining Anti-Reflective Coating layer, thereby forming a polymer sidewall; removing the insulating layer in accordance with a second dry etch process employing the photoresist pattern and the polymer sidewall as an etch mask, thereby forming a contact hole; and removing the photoresist pattern, the remaining Anti-Reflective Coating layer and the polymer sidewall.

8 Claims, 6 Drawing Sheets

METHOD OF FABRICATING A SEMICONDUCTOR DEVICE

BACKGROUND OF THE INVENTION

1. Field of the Invention

The present invention relates generally to a method of fabricating semiconductor devices, and more particularly, to a method of fabricating semiconductor devices capable of maintaining contact hole of fine size when the contact hole for bit line formation is defined.

2. Description of the Related Art

As is generally known, contact holes are employed as connection paths for electrically connected semiconductor devices and act as wiring or upper and lower wiring. Conventionally, the wiring is formed by filling metal into the contact hole.

However, as semiconductor devices become highly integrated, the size of the contact hole necessarily must be decreased. Therefore, recent efforts are focused on decreasing the size of the contact hole.

FIGS. 1A to 1D are cross sectional views for showing the steps of a conventional method for fabricating semiconductor devices and FIG. 2 is a TEM photograph of the structure shown in FIG. 1C.

Referring to FIG. 1A, oxidized silicon is deposited on a semiconductor substrate 100 including a transistor in accordance with a Chemical Vapor Deposition (hereinafter, referred to as CVD) process, thereby forming an insulating layer 104. Then, an Organic Bottom Anti-Reflective Coating layer 106 is formed on the insulating layer 104. The Anti-Reflective Coating layer 106 prevents reflection of exposed light in the following exposure process.

In the drawings, identification numeral 102 indicates conductive regions, such as source/drain, and al illustrates the minimum size of the contact hole defined with recent photo devices, being approximately between 0.16 and 0.18 μm, and desirably, 0.17 μm.

Subsequently, photoresist is applied on the Anti-Reflective Coating layer 106 and exposure and development processes are performed to form a photoresist (PR) pattern 108 exposing a part corresponding to the conductive regions 102. In order to minimize the size of the part exposing the part corresponding to the conductive regions on the photoresist pattern, the photoresist pattern is made by using a thermal flow process.

Referring to FIG. 1B, the Anti-Reflective Coating layer is removed by a first dry etch process 120 using the photoresist pattern PR 108 as a mask. The first dry etch process is performed by using a mixed gas comprising $CH_4$, Ar and $O_2$ as an etching gas, wherein the Anti-Reflective Coating layer exposed by the photoresist pattern PR 108 is removed by chemical reaction with the mixed gas. The Anti-Reflective Coating layer 107 remains after the first dry etch process. The remaining Anti-Reflective Coating layer 107 has a vertical profile.

Referring to FIGS. 1C and 2, the insulating layer 104 is removed in accordance with a second dry etch process 122 using the photoresist pattern PR 108 as a mask, thereby forming a contact hole 130. The second dry etch process 122 is performed by using a mixed gas comprising $C_4H_8$, $CH_2F_2$ and Ar as etching gas. The insulating layer exposed by the photoresist pattern (PR) 108 is removed by chemical reaction with the mixed gas.

The contact hole 130 has a size the same as that of the contact hole originally to be defined, that is, between 0.16 and 0.18 μm, and desirably 0.17 μm.

The insulating layer 105 remains after the second dry etch process 122.

Referring to FIG. 1D, the photoresist pattern (PR) 108 and the remaining Anti-Reflective Coating layer 107 are removed by a conventional process, such as polishing.

Referring to FIG. 1E, a metal layer is formed on the resulting structure by sputtering metal to cover the contact hole 130 and a pattern etch process is performed on the metal layer, thereby forming a bit line 132, as shown.

The following table 1 shows wafer CD values according to the conventional method, wherein 'C' indicates the center of the wafer, 'L' left of the center C, 'R' right of the center C, 'T' top, 'B' bottom, 'LT' is at a 45° angle between the left L and the top T, 'RT' is at a 45° angle between the right R and the top T, 'RB' is at a 45° angle between the right R and the bottom B and 'LB' is at a 45° angle between the left L and the bottom B.

TABLE 1

| | CD value (μm) | | | | | | | | | |
|---|---|---|---|---|---|---|---|---|---|---|
| layer | L | B | C | T | R | LT | RT | RB | LB | Mean |
| Insulating layer(105) | 0.145 | 0.1500 | 0.1550 | 0.1450 | 0.1440 | 0.1770 | 0.1800 | 0.1650 | 0.1680 | 0.1588 |

According to the conventional method, the contact hole having a dimension between 0.16 and 0.18 μm is obtained. However, it is difficult to fabricate a contact hole below 0.14 μm. A further problem is encountered in lowering the Critical Dimension CD uniformity of a wafer, since the reflow process is performed on the photoresist pattern.

SUMMARY OF THE INVENTION

Therefore, the present invention has been made to solve the above-mentioned problems and the object of the present invention is to provide a method of fabricating semiconductor devices capable of controlling the size of contact hole for bit line formation below 0.14 μm.

In order to accomplish the above object, the present invention comprises the steps of: forming an insulating layer and an Anti-Reflective Coating layer on a substrate, the substrate including conductive regions; forming a photoresist pattern opening over the conductive regions on the Anti-Reflective Coating layer; etching the Anti-Reflective Coating layer in accordance with a first dry etch process using a mixed gas of $SO_2$ and He and employing the photoresist pattern as an etch mask and at the same time, forming a polymer sidewall by attaching polymer generated in the first dry etch process to the sides of the remaining Anti-Reflective Coating layer; forming a contact hole by removing the insulating layer in accordance with a second dry etch process employing the photoresist pattern and the polymer sidewall as an etch mask; and removing the photoresist pattern, the remaining Anti-Reflective Coating layer and the polymer sidewall.

DETAILED DESCRIPTION OF THE INVENTION

The above objects, and other features and advantages of the present invention will become more apparent after reading the following detailed description when taken in conjunction with the appended drawings.

Figure 1A:
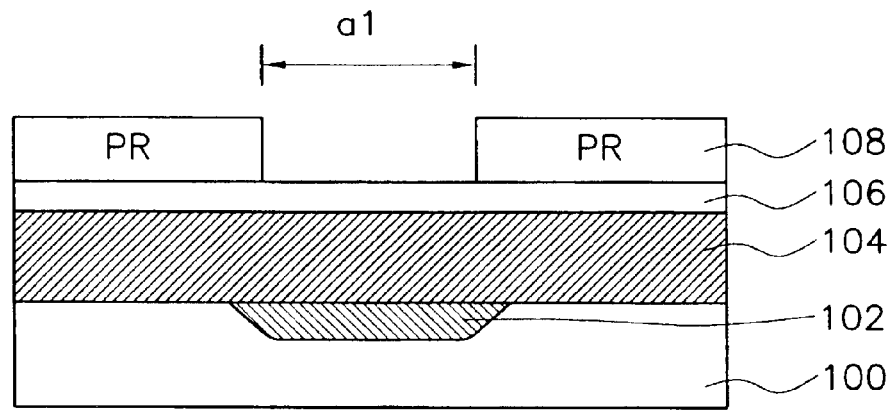
FIGS. 1A to 1E are cross sectional views for showing the steps of a conventional method for fabricating a semiconductor device.
Figure 1B:
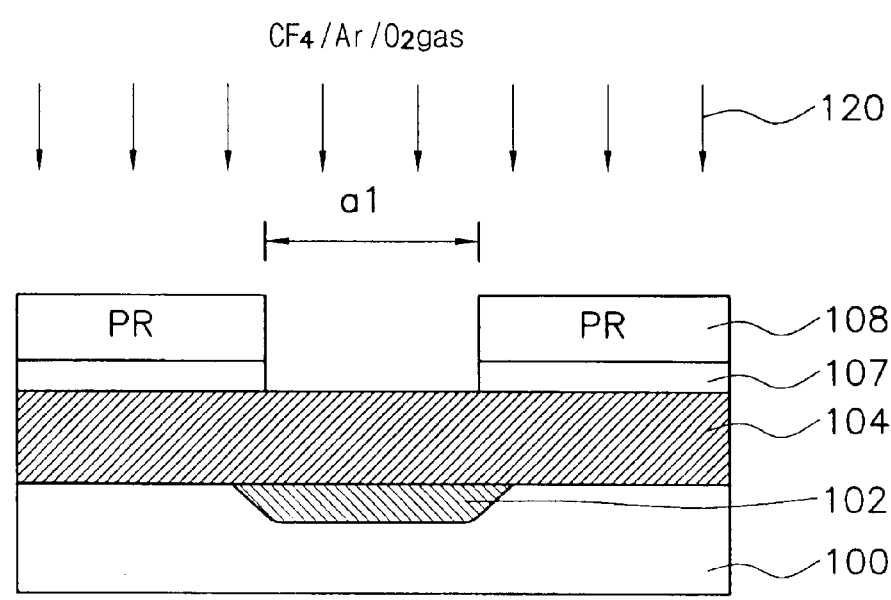
Figure 1C:
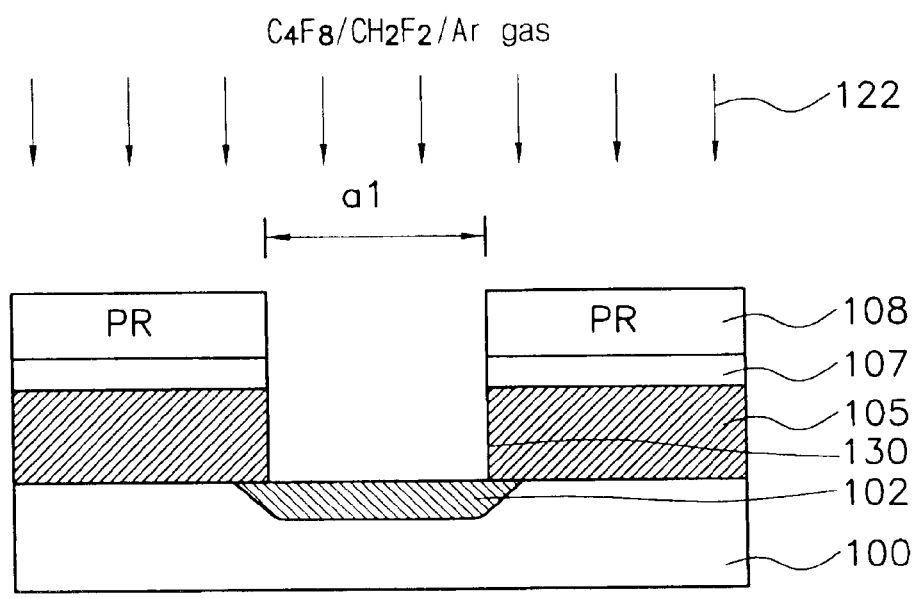
Figure 1D:
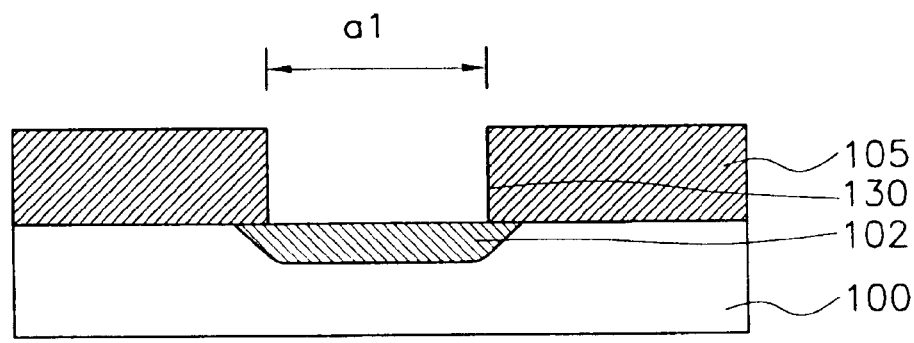
Figure 1E:
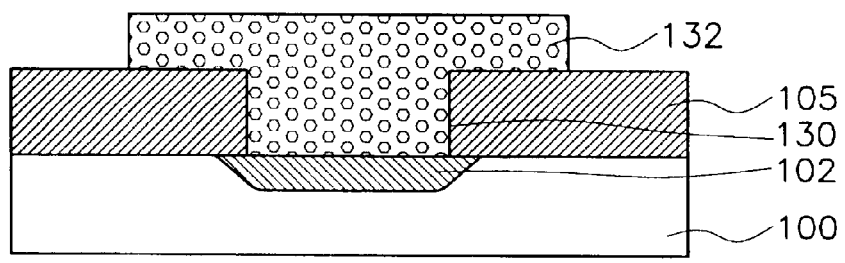
Figure 2:
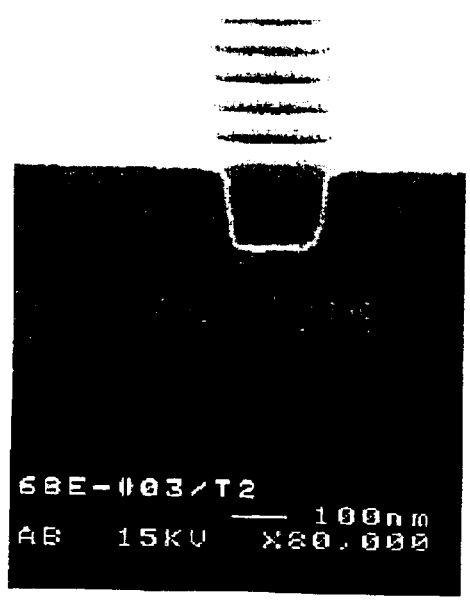
FIG. 2 is a TEM photograph of the structure shown in FIG. 1C.
Figure 3A:
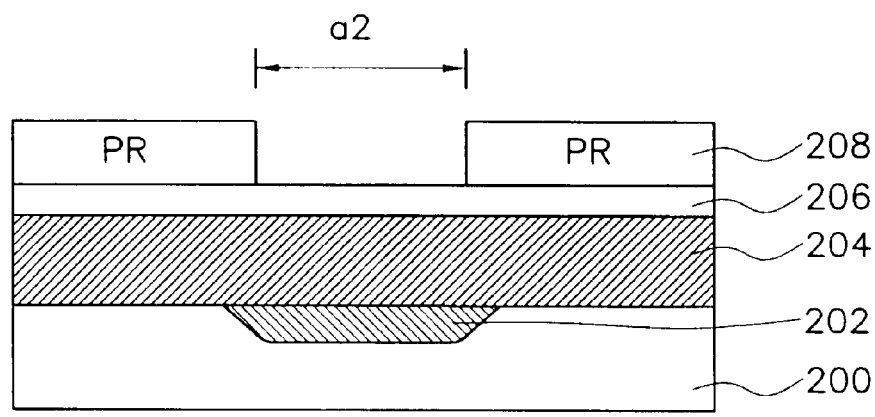
FIGS. 3A to 3E are cross sectional views for showing the steps of a method for fabricating semiconductor device according to the present invention.
Figure 3B:
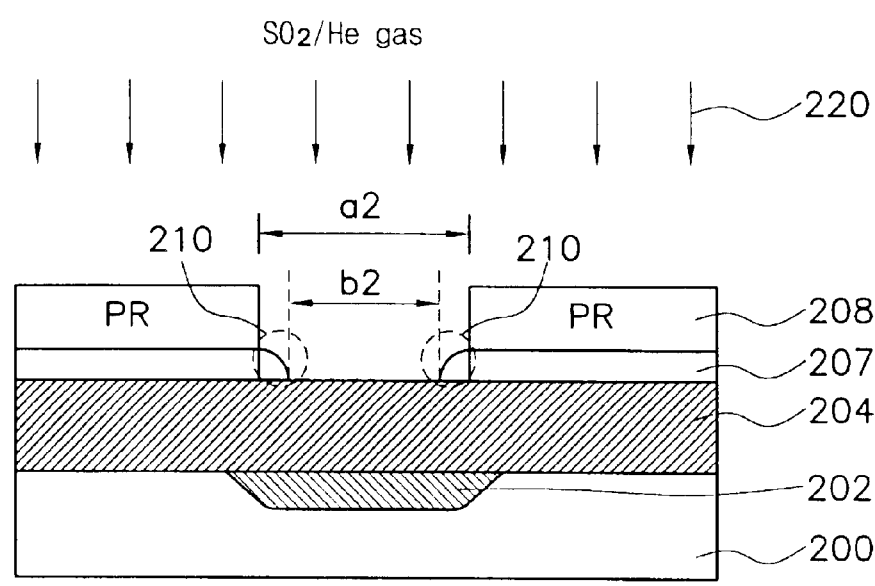
Figure 3C:
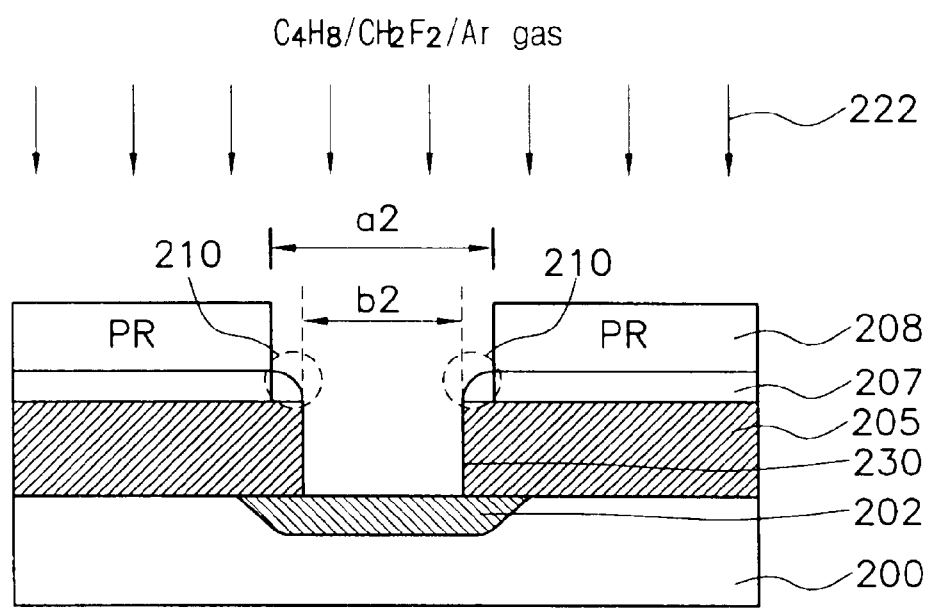
Figure 3D:
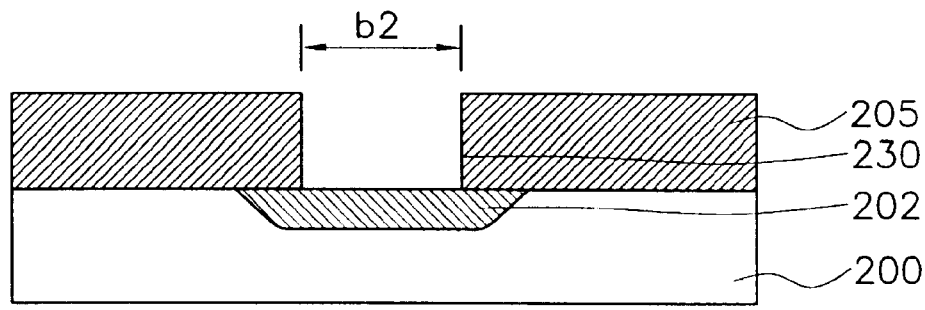
Figure 3E:
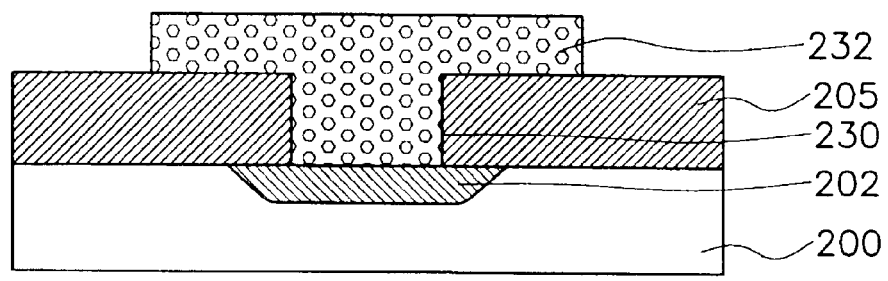
Figure 4:
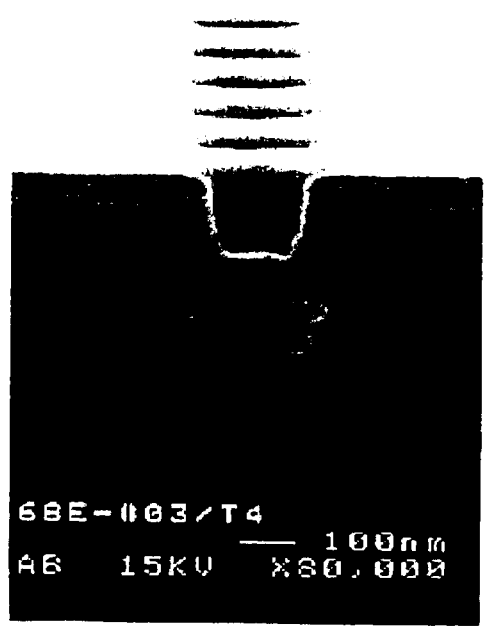
FIG. 4 is a TEM photograph of the structure shown in FIG. 3C.

FIGS. 3A to 3E are cross sectional views for showing the steps of a method for fabricating a semiconductor device according to the present invention and FIG. 4 is a TEM photograph of the structure shown in FIG. 3C.

Referring to FIG. 3A, first, an insulating layer 204 is formed on a semiconductor substrate 200 by performing a CVD process to deposit an oxidized silicon and an Anti-Reflective Coating layer 206 formed on the insulating layer 204 with organic materials. The semiconductor substrate 200 has a transistor including conductive regions 202, such as a source/drain region, and a gate (not shown).

Subsequently, a photoresist is applied on the Anti-Reflective Coating layer 206 and then, exposure and development processes are performed to form a photoresist pattern PR 208 exposing a part of the photoresist pattern over the conductive regions 202.

An opening of the photoresist pattern is designated as a2, having a minimum contact hole size to be defined in recent known photo devices, that is between approximately 0.16 and 0.18 $\mu$m, and desirably 0.17 $\mu$m.

Referring to FIG. 3B, the Anti-Reflective Coating layer is etched in accordance with a first dry etch process 220 employing the photoresist pattern PR 208 as an etch mask. The first dry etch process 220 is performed by employing a mixed gas of $SO_2$ and He as an etch gas, wherein the exposed Anti-Reflective Coating layer is removed by the chemical reaction of the mixed gas and the Anti-Reflective Coating layer exposed around the photoresist pattern PR 208.

In the first dry etch process 220, the $SO_2$ gas has a reactivity lower than that of the $O_2$ gas. The $SO_2$ gas has no lateral etch properties, and thereby generates polymer due to reaction with etch floating particles. The polymer is attached to the exposed side of the remaining Anti-Reflective Coating layer to form a polymer sidewall 210, as shown.

The distance between polymer sidewalls 210 is indicated as b2 and is measured between the polymer sides, and b2 and has a dimension of between 0.13 and 0.15 $\mu$m, smaller than a1, and desirably the distance is 0.14 $\mu$m.

Referring to FIGS. 3C and 4, the insulating layer is removed in accordance with a second dry etch process 222 employing the photoresist pattern 208 and the insulating spacer 210 as an etch mask, thereby forming a contact hole 230. The second dry etch process 222 is performed by using a mixed gas of $C_4H_8$, $CH_2F_2$ and Ar as an etch gas and the insulating layer etched by the mixed gas has a vertical profile, perpendicular to the surface of the substrate 200.

As a result of the second dry etch process 222, the contact hole 230 has a dimension equal to b2, smaller than that of the dimension of a2.

Referring to FIG. 3D, the photoresist pattern and the Anti-Reflective Coating layer are removed by a conventional process, such as chemical mechanical polishing (CMP).

Referring to FIG. 3E, a metal layer is formed on the resulting structure by sputtering metal to cover the contact hole 230 and then, the metal layer is subjected to a pattern etch process to form a bit line 232, as shown.

The following table 2 shows CD value of a wafer according to the present invention, wherein CD values are uniform in the center C, right R, left L, top T, and bottom B of wafer, compared with that of according to the conventional method set forth in Table 1. LT, RT, RB and LB are similarly defined as in Table 1.

TABLE 2

| Layer | CD value ($\mu$m) | | | | | | | | | |
|---|---|---|---|---|---|---|---|---|---|---|
| | L | B | C | T | R | LT | RT | RB | LB | Mean |
| Insulating layer(205) | 0.1480 | 0.1450 | 0.1430 | 0.1490 | 0.1430 | 0.1550 | 0.1520 | 0.1480 | 0.1470 | 0.1478 |

As described above, according to the present invention, $SO_2$ gas is supplied as an etch gas in the etch process of the Anti-Reflective Coating layer. Polymers, due to the $SO_2$ gas, are attached to the exposed side of the Anti-Reflective Coating layer, thereby forming a polymer sidewall employed as a secondary etch mask in the etch process of the insulating layer with the photoresist pattern. Therefore, the size of contact hole for bit line formation is decreased to that of the polymer sidewall secondary etch mask.

According to the present invention, the etch properties of the lateral Anti-Reflective Coating layer are prevented by the increased size of the etch mask provided by the polymers, as a result of the $SO_2$ gas supplied as an etch gas in the etch process of the Anti-Reflective Coating layer. Therefore, the size of contact hole for bit line formation is controlled to a finer size below 0.14 $\mu$m.

Moreover, according to the present invention, it is possible to improve CD uniformity of the wafer by omitting a photoresist pattern reflow process.

Although the preferred embodiments of the invention have been disclosed for illustrative purposes, those skilled in the art will appreciate that various modifications, alterations, additions and substitutions are possible, without departing from the scope and spirit of the invention as set forth in the accompanying claims.

What is claimed is:

1. A method for fabricating semiconductor device comprising the steps of:
   sequentially forming an insulating layer and an Anti-Reflective Coating layer on a substrate, the substrate including conductive regions;
   forming a photoresist pattern opening over the conductive regions on the Anti-Reflective Coating layer;
   etching the Anti-Reflective Coating layer in accordance with a first dry etch process using a mixed gas of $SO_2$ and He and employing the photoresist pattern as an etch mask and at the same time, attaching polymers resulting from the first dry etch process to the side of remaining Anti-Reflective Coating layer, thereby forming a polymer sidewall;
   removing the insulating layer in accordance with a second dry etch process employing the photoresist pattern and the polymer sidewall as an etch mask, thereby forming a contact hole; and
   removing the photoresist pattern, the remaining Anti-Reflective Coating layer and the polymer sidewall.

2. The method for fabricating a semiconductor device according to claim 1, wherein the Anti-Reflective Coating layer further comprises organic materials.

3. The method for fabricating a semiconductor device according to claim 1, wherein the mixed gas further comprises C-F line gas.

4. The method for fabricating a semiconductor device according to claim 1, wherein the mixed gas further comprises $CF_4$ gas.

5. The method for fabricating a semiconductor device according to claim 1, wherein the second dry etch process is performed by using a mixed gas comprising $C_4H_8$, $CH_2F_2$ and Ar.

6. The method for fabricating a semiconductor device according to claim 1, further comprising the step of forming a bit line filled in the contact hole on the insulating layer, after the step of removing the photoresist pattern.

7. The method for fabricating a semiconductor device according to claim 1, wherein the photoresist pattern has an opening having a dimension between 0.16 and 0.18 $\mu$m.

8. The method for fabricating semiconductor device according to claim 1, wherein the contact hole has a lateral size dimension of between 0.13 and 0.15 $\mu$m.

* * * * *